(12) United States Patent
Cheng et al.

(10) Patent No.: US 7,679,416 B2
(45) Date of Patent: Mar. 16, 2010

(54) HIGH SPEED CLOCK DISTRIBUTION TRANSMISSION LINE NETWORK

(75) Inventors: Chung-Kuan Cheng, San Diego, CA (US); Hongyu Chen, Sunnyvale, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 11/596,968

(22) PCT Filed: May 23, 2005

(86) PCT No.: PCT/US2005/018176

§ 371 (c)(1),
(2), (4) Date: Mar. 6, 2007

(87) PCT Pub. No.: WO2005/117263

PCT Pub. Date: Dec. 8, 2005

(65) Prior Publication Data

US 2008/0030252 A1    Feb. 7, 2008

Related U.S. Application Data

(60) Provisional application No. 60/573,922, filed on May 24, 2004.

(51) Int. Cl.
*H03K 19/003* (2006.01)

(52) U.S. Cl. .................. 327/293; 327/564; 327/565; 257/758

(58) Field of Classification Search ......... 327/291–293, 327/295, 299, 564–566; 257/758, 773, 775, 257/776
See application file for complete search history.

(56) References Cited

U.S. PATENT DOCUMENTS 5,656,963 A * 8/1997 Masleid et al. ............... 327/297

(Continued)

FOREIGN PATENT DOCUMENTS

JP          06-224605          8/1994

(Continued)

OTHER PUBLICATIONS

P.J. Restle et al., "The Clock Distribution of the Power4 Microprocessor", IEEE International Solid-State Circuits Conference, Session 8.4, 2002.

(Continued)

*Primary Examiner*—An T Luu
(74) *Attorney, Agent, or Firm*—Greer, Burns & Crain, Ltd.

(57) ABSTRACT

The invention is directed to a method for clock distribution and VLSI circuits include a clock distribution network. In a method of the invention, a transmission lines are patterned as to connect a clock tree and a periodic waveform clock, preferably a sine waveform, is used to control clock skew, even at frequencies extending into the gigahertz range. In an exemplary embodiment of the invention, an overlay includes differential pairs of transmission lines that connect the drivers of a clock distribution tree. In preferred embodiments of the invention, an H-tree clock distribution scheme is overlayed with a spiral of transmission lines, each realized by a differential conductors and driven using a sinusoidal standing wave to distribute global clock signals into local regions of the chip. Each transmission line connects drivers in the H-tree that are at the same level of the H-tree. In a VLSI chip according to an embodiment of the invention, the transmission line overlay delivers sinusoidal clock signals to local areas that are locally converted into digital clock signals. The invention thus presents a passive technique for clock distribution.

11 Claims, 6 Drawing Sheets

U.S. PATENT DOCUMENTS

| | | | |
|---|---|---|---|
| 5,668,484 A * | 9/1997 | Nomura | 326/93 |
| 6,037,820 A | 3/2000 | Ishizaka | |
| 6,098,176 A | 8/2000 | Coteus et al. | |
| 6,205,571 B1 | 3/2001 | Camporese | |
| 6,208,702 B1 | 3/2001 | Ghoshal | |
| 6,378,080 B1 * | 4/2002 | Anjo et al. | 713/500 |

FOREIGN PATENT DOCUMENTS

| | | |
|---|---|---|
| JP | 04-023229 | 1/2004 |

OTHER PUBLICATIONS

F. O'Mahoney et al., "Design of a 10 GHz Clock Distribution Network Using Coupled Standing—Wave Oscillators", DAC 2003, pp. 682-687.

N.A. Kurd et al., "A Multigigahertz Clocking Scheme for the Pentium® 4 Microprocessor", IEEE Journal of Solid-State Circuits, vol. 36, No. 11, Nov. 2001, pp. 1647-1653.

* cited by examiner (a) H-tree

HIGH SPEED CLOCK DISTRIBUTION TRANSMISSION LINE NETWORK

PRIORITY CLAIM

Applicants claim priority benefits under 35 U.S.C. §119 on the basis of Patent Application No. 60/573,922, filed May 24, 2004.

STATEMENT OF GOVERNMENT INTEREST

This invention was made with Government assistance under NSF Grant No. CCR9987678. The Government has certain rights in this invention.

FIELD OF THE INVENTION

The field of the invention is VLSI (very large scale integrated) devices, e.g. microprocessors.

BACKGROUND ART

Commercial microprocessors currently operate on clock signals in the gigahertz range. The scale of today's VLSI designs requires the designs to account for clock skew. Clock skew is the relative difference in time that the clock signal reaches different parts of the integrated circuit. In a microprocessor, for example, a global clock signal must be distributed to different parts of the chip. This internal clock signal must be distributed to a large number of clock pins. As clock frequencies increase, the skew can be a limiting factor. With increasing clock frequency, the clock skew caused by many nondeterministic factors such as process variations, supply voltage fluctuation and temperature gradient consumes a significant portion of clock period. For high performance synchronous circuitry, the design of a robust global clock distribution system which can sustain various parameter variations becomes an increasingly difficult and time-consuming task.

As a result, reducing clock skew is a goal in the art. RC shunted networks have been successfully used to reduce the clock skew under process variations. Three wide spine shunts have been proposed to reduce the skew between the leaf nodes of a very deep driver tree. See, e.g., N. A. Kurd, et al, "A Multigigahertz Clocking Scheme for the Pentium® 4 Microprocessor," IEEE Journal of Solid-State Circuits, Vol. 36, No. 11, November 2001 pp. 1647-53. Others have proposed a clock mesh driven by balanced H-tree for global clock distribution. See, e.g., M. Orshansky, L. Milor, P. Chen, K. Keutzer and C. Hu, Impact of Spatial Intrachip Gate Length Variability on the Performance of High-Speed Digital Circuit, IEEE trans. on CAD, p. 544-553, vol. 21, No. 5, May 2002.

However, when the clock frequency increases to multi-giga hertz range, the inductance effect of the shunt wires becomes significant. Clock meshes are used in the industry to reduce skew. Clock meshes form an RC wire network. The inductance effect of the RC network is ignored at clock frequencies of present commercial chips, e.g., the 4 GHz Pentium 4. However, the trend is toward higher clock frequencies at which the inductance effect can no longer be ignored. Additionally, for example, at a 10 GHz clock rate, the time of flight between two corners of a chip is comparable to the clock cycle. The RC model of the shunt effect is not valid at such frequencies. The inductance of the shunt can even cause worse skew.

Active circuits have been proposed to address clock skew. Particular examples include the following. Phase detectors and coupled oscillators have been proposed with shunts of less than a quarter wavelength to lock the oscillators together. See, Galton et al, "Clock Distribution Using Coupled Oscillators," Proc. of ISCAS 1996, vol. 3, pp. 217-220. Active feedback with phase detectors and distributed phase locked loops have also been proposed. Gutnik and Chandraksan, "Active GHz Clock Network Using Distributed PLLs," IEEE Journal of Solid-State Circuits, pp. 1553-1560, vol. 35, No. 11, November 2000. Combined clock generation and distribution using standing wave oscillators has been proposed. O'Mahony et al. "Design of a 10 GHz Clock Distribution Network Using Coupled Standing-Wave Oscillators," Proc. of DAC, pp. 682-687, June 2003. This work distributes sine waves, as opposed to the conventional approach of distributing square waves. However, the distribution scheme of O'Mahony et al. does not use a global clock source. Instead, clocks are generating locally and distributed. Wood, et al., "Rotary Traveling-Wave Oscillator Arrays: A New Clock Technology" IEEE JSSC, pp. 1654-1665, November 2001. The use of active components may be successful to overcome clock skew at high clock frequencies. Compared to a passive scheme, though, the active component approach raises stability issues and, in some cases, may be more sensitive to process variations during fabrication.

SUMMARY OF THE INVENTION

The invention is directed to a method for clock distribution and VLSI circuits include a clock distribution network. In a method of the invention, a transmission lines are patterned as to connect a clock tree and a periodic waveform clock, preferably a sine waveform, is used to control clock skew, even at frequencies extending into the gigahertz range. In an exemplary embodiment of the invention, an overlay includes differential pairs of transmission lines that connect the drivers of a clock distribution tree. In preferred embodiments of the invention, an H-tree clock distribution scheme is overlayed with a spiral of transmission lines, each realized by a differential conductors and driven using a sinusoidal standing wave to distribute global clock signals into local regions of the chip. Each transmission line connects drivers in the H-tree that are at the same level of the H-tree. In a VLSI chip according to an embodiment of the invention, the transmission line overlay delivers sinusoidal clock signals to local areas that are locally converted into digital clock signals. The invention thus presents a passive technique for clock distribution. The technique is robust, as the differential transmission lines are relatively insensitive to process variations. For example, when the lines are further apart capacitance increases while inductance decreases, providing a form of self-compensation responsive to process variations.

In a preferred H tree embodiment overlayed with a spiral set of transmission lines, each level in the H-tree is connected a transmission line. In the overlay, shorter spiral transmission lines may be made wider, and become gradually thinner in the longer sets of transmission lines in the spiral. The geometry of the network of transmission lines will be dictated by the nature of the clock network that is interconnected by the transmission lines, and the H-tree—spiral transmission line embodiment presents an example that will be appreciated by artisans to vary consistently with a clock tree having a different shape.

Embodiments of the invention also include optimized clock distribution networks. The invention presents a method to identify optimal total transmission line areas for single level and multiple level transmission line clock distribution networks.

DETAILED DESCRIPTION OF THE PREFERRED EMBODIMENTS

Figure 1:
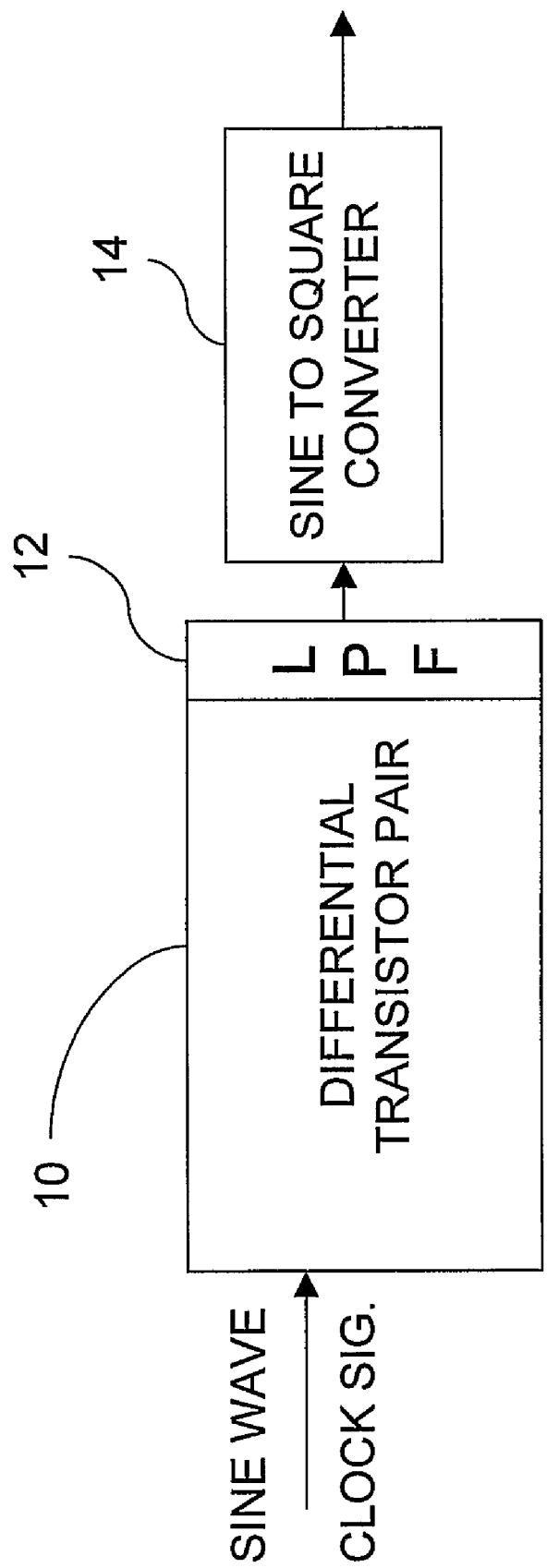
FIG. 1 (prior art) is a block diagram of a clock driver that may be used locally in a clock distribution network of the invention to convert a distributed sine wave clock signal to a square wave for local registers in a VLSI circuit.

The invention provides clock distribution methods and circuits a hybrid structure of a clock distribution tree, e.g., an H-tree, and a differential transmission line shunt to shunt a level of the clock distribution tree, or more preferably, multiple differential transmission line shunts to shunt multiple levels of the clock distribution tree. The clock is distributed as differential signals of periodic waves, e.g., sinusoidal waves. Even at high frequencies, e.g., 10 GHz and higher, the clock distribution method of the invention provides an output to levels of the clock distribution tree that exhibits very small skew. In a VLSI circuit of the invention, a square-wave clock signal is recovered locally and provided to registers all over the circuit.

In a preferred embodiment, an H-tree clock distribution circuit is shunted by transmission lines. The transmission lines are driven at discrete points and bent into spiral pattern in order to link the clock drivers of the H-tree clock distribution network. The clock drivers of the H-tree are shunted level by level. The shunt lengths between the clock drivers are an integral multiple of wavelength. For an ideal case that the line is lossless, a standing wave can lock the clock drivers to zero skew. For lossy shunts, embodiments of the invention provided an optimized wire width for the transmission lines to produce the smallest skew for the multi-level network based on the analytical skew function.

Clock distribution methods and circuits in accordance with preferred embodiments of the invention can provide several advantages. There is no direct feedback path from the transmission line network to the clock source. The transmission lines are a linear network, and thus the design and optimization involve no active components. Another advantage is that the energy storage capability of the locked standing wave in the transmission line can mitigate the clock jitter. Additionally, power consumption the network is low as a result of the resonance effect of the transmission line.

Preferred embodiments of the invention will now be discussed with respect to the drawings, while artisans will appreciate broader aspects of the invention from the discussion of the preferred embodiments. Schematic drawings are used, and will be understood by artisans. In the preferred embodiments, differential sinusoidal waves are used for global clock distribution. The sinusoidal waveform simplifies the analysis of resonance phenomena of the transmission line, permitting implementation of optimization methods of the invention. In addition, the differential signals provide a well-controlled current return loop, to thus improve the predictability of inductance value.

In a VLSI implementation, the distributed sine wave clock signals will have to be converted locally to square wave signals. A clock driver may be used for this conversion. Such an exemplary driver has two stages. An exemplary clock driver for conversion is described, for example, in O'Mahony et al., "Design of a 10 GHz Clock Distribution Network Using Coupled Standing-Wave Oscillators," DAC 2003, pp. 682-687, June 2003.

FIG. 1 is a block diagram illustrating a two-stage clock driver for local conversion of sine wave to a square wave based upon O'Mahony et al. A first stage differential transistor pair 10 includes a small gate-overdrive for complete current switching. It amplifies and limits the signal so the output amplitude is roughly independent of the input amplitude. A low-pass filter 12 attenuates the harmonics added by the limiting amplifier that would otherwise cause amplitude-dependent skew. A sine-to-square, converter 14 forms a second stage. As indicated in O'Mahony, use of cross-coupled inverters and a shunt resistor in the sine-to-square converter can achieve a well-controlled 50% duty cycle over process, temperature, frequency, and supply variation. This type of two-stage clock driver can achieve below 1 ps amplitude-dependant skew.

In the following discussion of preferred embodiments, and particularly, the discussion of optimized transmission line wire widths in preferred embodiments, a simple linear variation model is used to represent the systematic spatial variations on wire widths and transistor lengths. For any location (x, y) on the chip, the actual geometrical parameter $d=d_0+k_x x+k_y y$, where $d_0$ is the nominal parameter and $k_x$, $k_y$ are the horizontal, vertical variation coefficient, respectively. The maximum variations across the chip are assumed to be $\pm 10\%$ of the ideal value. This "pseudo-deterministic" linear variation model can be regarded as a "worst case" scenario of the probabilistic variations. This simple model can be replaced with more sophisticated variation models when implementing wire width optimizations in accordance with the invention, as will be appreciated by artisans. When analyzing clock skew levels for preferred embodiments and optimizations, the supply voltage fluctuation is taken into account. Specifically, it is assumed that the supply voltages are a set of independent random variables within $\pm 10\%$ of a nominal $V_{dd}$ value.

Figure 2:
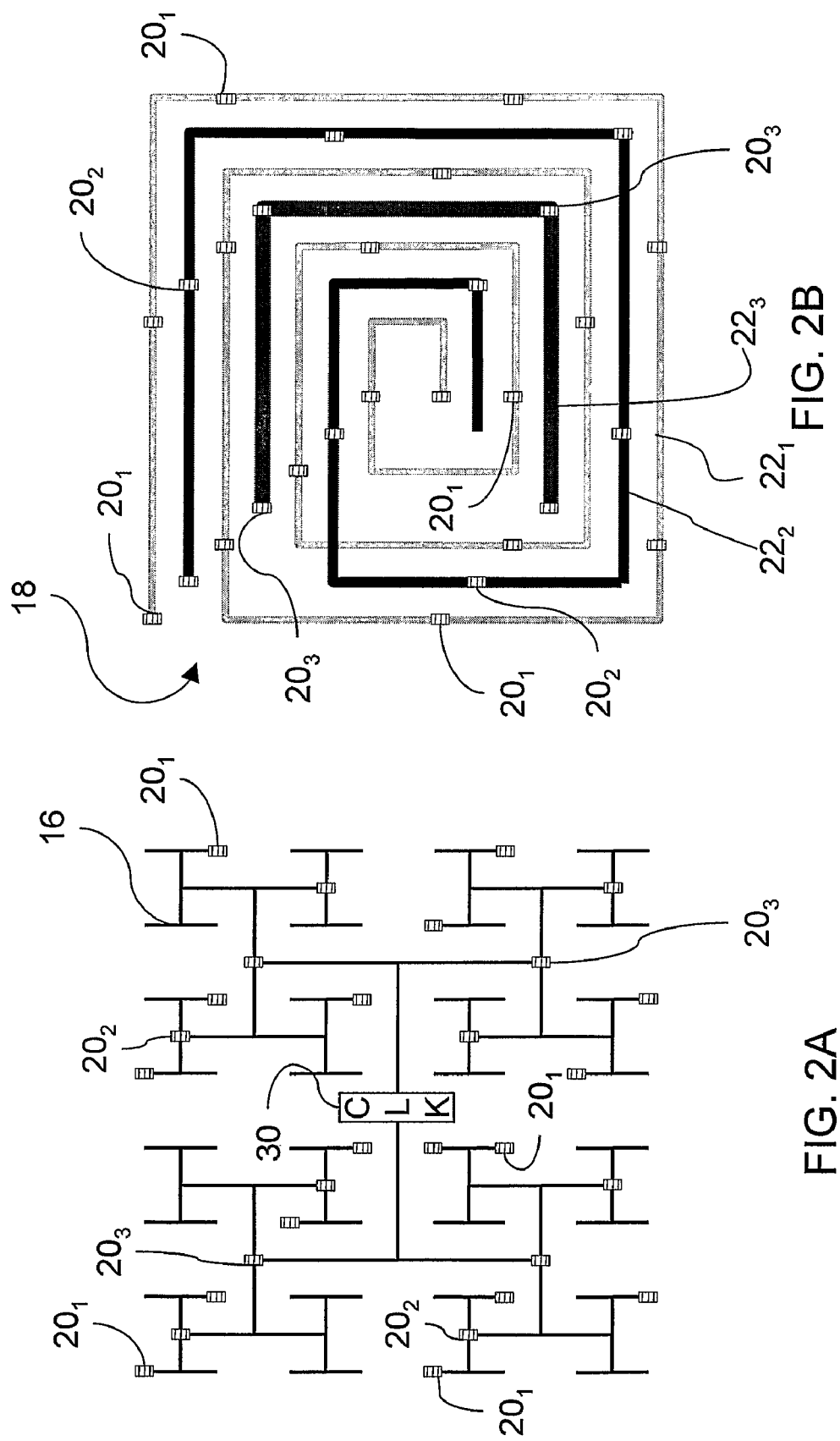
FIGS. 2A and 2B are schematic diagrams illustrating a preferred embodiment clock distribution circuit of the invention, with FIG. 2A illustrating an H-tree clock distribution network and FIG. 2B illustrating a hierarchical transmission line shunt network to shunt clock drivers in the H-tree clock distribution network of FIG. 2A.

FIG. 2A shows an H-tree clock distribution network 16 and FIG. 2B shows a transmission line shunt network 18 for use with the H-tree clock distribution 16 network of FIG. 2A. The figures are presented separately for clarity, as an overlay of the two figures hides the structure of the H-tree network. The H-tree network includes a plurality of clock drivers $20_N$, each of which belong to one of three levels in the H-tree network. A number of the drivers from each level are labelled as either $20_1$, $20_2$, or $20_3$, and the same drivers that are labelled in FIG. 2A are also labelled in the transmission line shunt network 18 of FIG. 2B. Each of three differential transmission lines $22_1$, $22_2$, and $22_3$ shunts clock drivers $20_N$ in a corresponding level of the H-tree clock distribution network 16.

Figure 3:
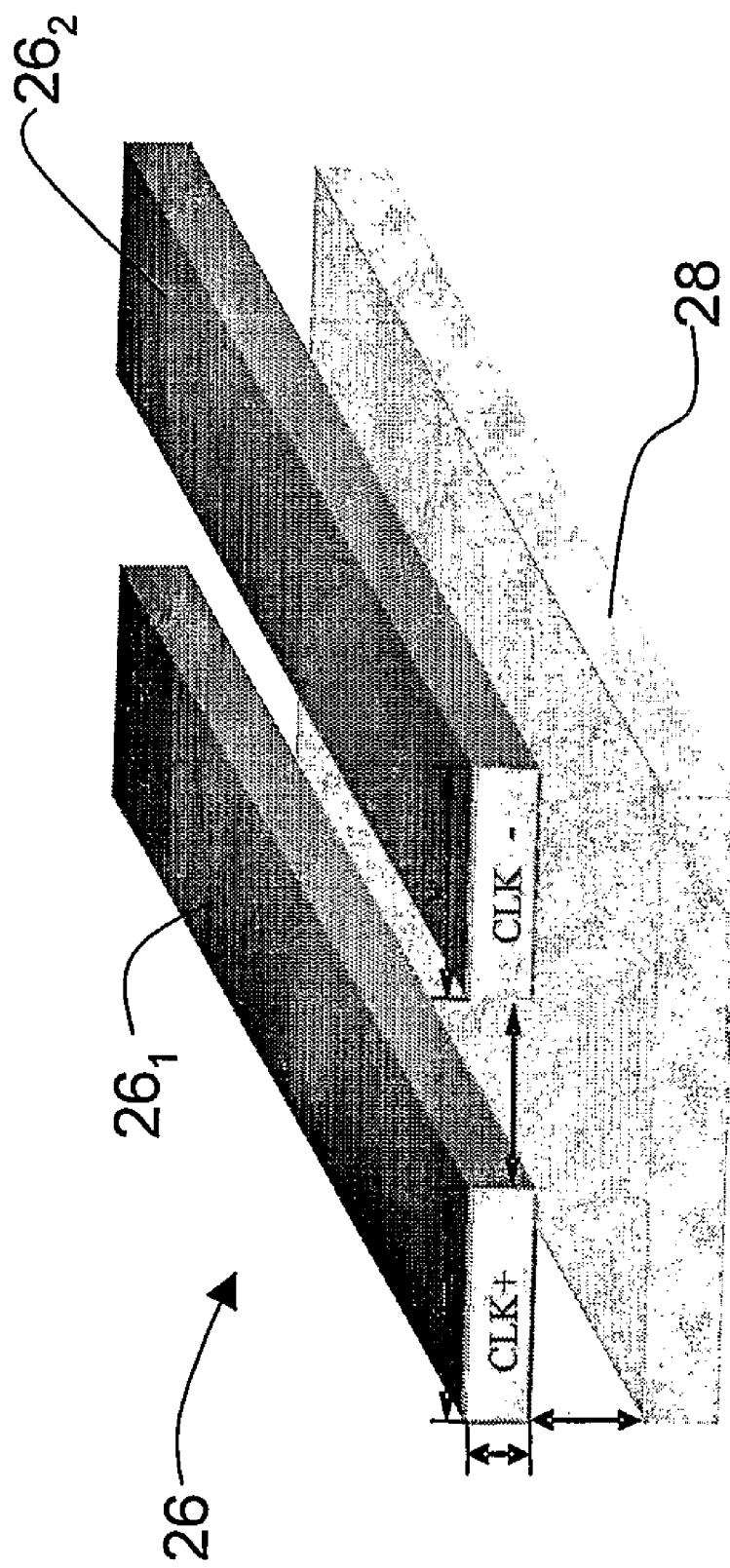
FIG. 3 is a partial view of a pair of transmission lines used in the transmission line shunt network of FIG. 2B.

The natural frequency shunt wires in the differential transmission lines $22_1$, $22_2$, and $22_3$ shunts are sized to reduce the skew between clock drivers $20_1$, $20_2$, $20_3$. The transmission lines $22_1$, $22_2$, and $22_3$ are arranged in hierarchical transmission line spirals. Each spiral consists of a pair of multiple wavelength long coplanar differential pair 26, including separate conductors $26_1$ (clock +) and $26_2$ (clock –) disposed relative a ground plane 28, as shown in FIG. 3. The spiral shape of the transmission lines $22_1$, $22_2$, and $22_3$ results from the layout of the clock distribution network. Other networks can produce different shapes. Arbitrary shaped transmission line shunt networks may be utilized, however, if a necessary condition is met. The necessary condition to meet is that the distance of transmission lines between clock drivers is an integral multiple of the wavelength of the clock signal being distributed.

Figure 4:
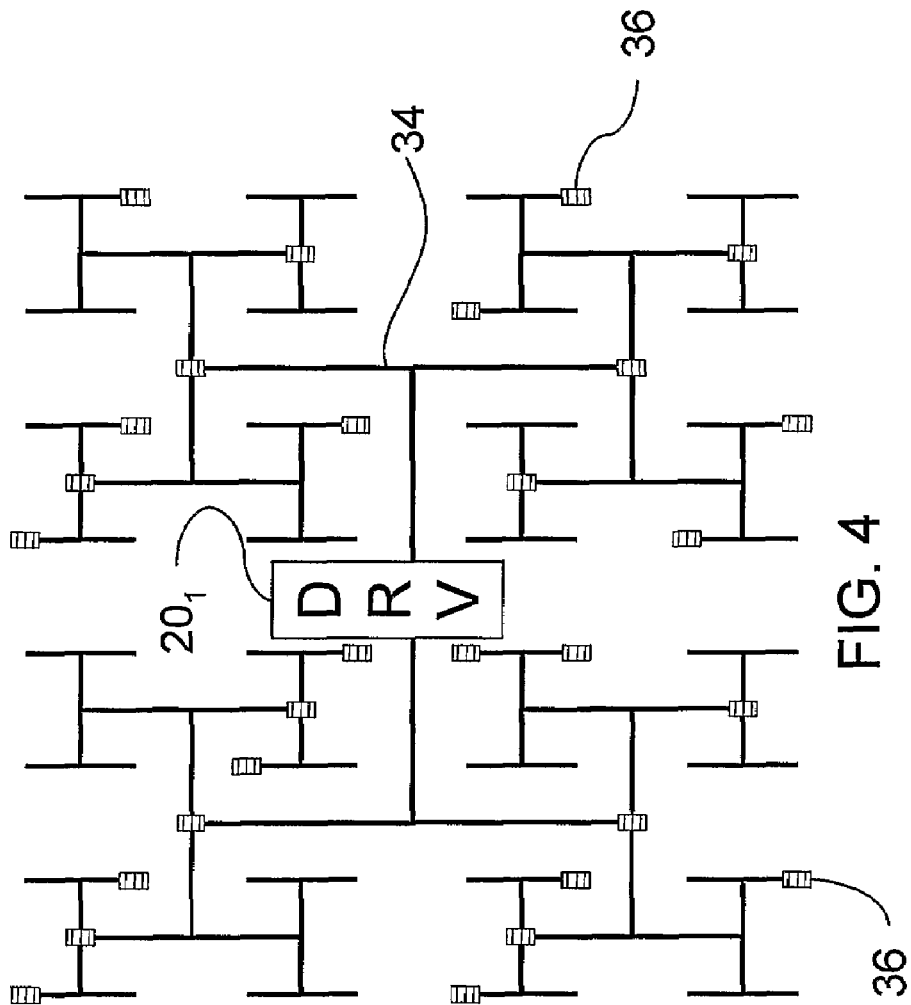
FIG. 4 illustrates the local distribution of a clock signal from a lowest level clock driver in the clock distribution circuit of FIGS. 2A and 2B.

Clock drivers $20_N$ are evenly distributed on every spiral and the separation between two neighboring clock drivers is one wavelength. The H-tree network 16 distributes sinusoidal clock signals from a central clock source 30 at its center which would be, for example, the center of a VLSI chip) to all the clock drivers $20_N$. The signal arriving time of all the clock drivers $20_N$ on a common differential transmission line $22_N$ of the shunt network 18. In a VLSI implementation, each of the lowest level clock drivers 20, would connect to a local distribution tree or mesh 34, as shown in FIG. 4, to send clock signals from the clock drivers on the lowest level spiral to innumerous clocking elements 36 in the VLSI circuit.

The transmission lines $22_1$, $22_2$, and $22_3$ in the transmission line shunt network 18 may be optimized. Variations in the sizes, relative distances, etc. of the differential pairs 26 that make up the transmission lines $22_1$, $22_2$, and $22_3$ in can be set to achieve various levels of skew. Minimized skew is produced in preferred embodiments, while designers may implement less than optimal shunt line networks 18 in accordance with the invention while still achieving significant advantages.

Outlining the design approach for transmission line shunt networks 18 of the invention will provide artisans with the ability to account for trade-offs in particular VLSI implementations. For example, for the same amount of routing area, assigning clock drivers to spirals at different levels can have a different impact on clock skew. In the following, an optimal way to distribute the routing resources to the spirals at different levels of the shunt network 18 such that the minimum skew is achieved on the lowest level spiral with given routing area budget will be discussed.

The optimization problem is addressed as a transmission lines $22_1$, $22_2$, and $22_3$ spirals sizing problem. It is assumed that there is a spiral network applied to an H-tree as in the embodiment of FIGS. 2A and 2B. It is assume that the total routing area is constrained. The goal is to minimize the skew on the lowest level of the clock distribution network 16, namely, at the drivers $20_1$. The optimum wire width $w_i$ of spirals at level i, for i=1 to n, will be determined so that clock skew is minimized.

Figure 5:
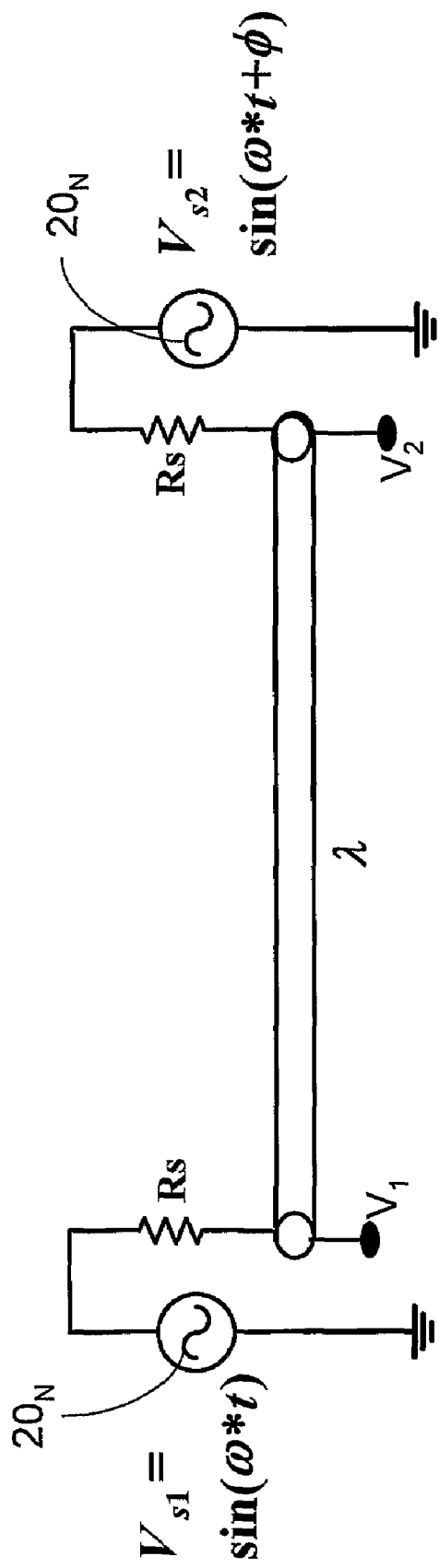
FIG. 5 is a simplified circuit diagram of two clock drivers from the circuit of FIGS. 2A and 2B and a transmission line shunt from the shunt network of FIG. 2B.

A simplified circuit model for the transmission lines $22_1$, $22_2$ and $22_3$ is shown in FIG. 5 to study the skew reduction mechanism of a one wavelength long transmission line shunt. In FIG. 5 two clock drivers $20_N$ with driving resistance $R_s$ and input phase shift (skew) $\Phi$ are connected by an RLGC (resistance, inductance, conductance, capacitance) transmission line $22_N$ of exactly one wave length long. The output at two separated terminals, $V_1$ and $V_2$ are synchronized by the shunt transmission line $22_N$.

Figure 6:
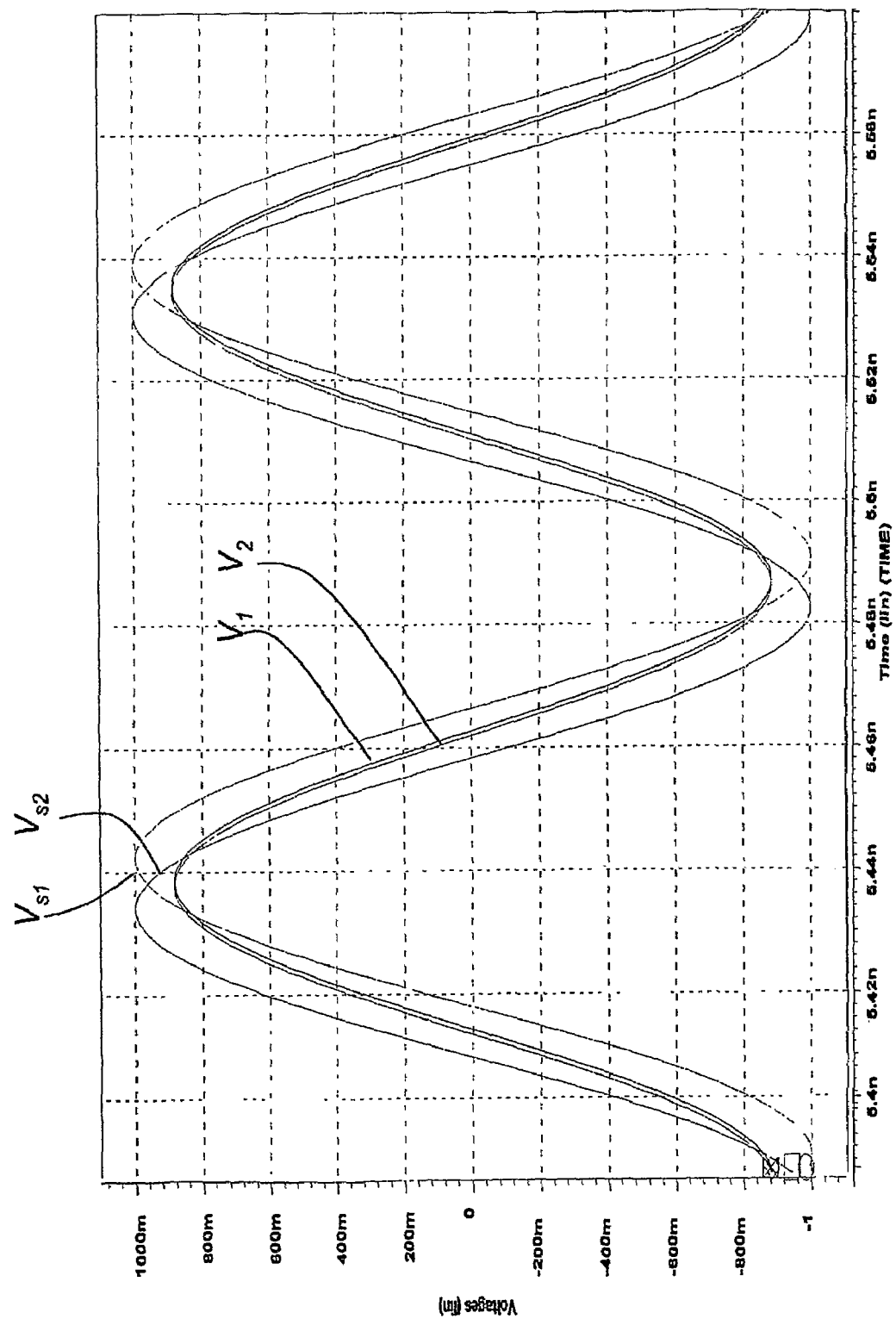
FIG. 6 shows simulated wave forms for the circuit model of FIG. 5

FIG. 6 shows simulated wave forms for the circuit model of FIG. 5. If it is assumed that an input skew $\Phi$ between input voltages $V_{s1}$ and $V_{s2}$ is 30 degrees, the resultant skew between output voltages $V_1$ and $V_2$ is only 0.7 degree. In FIG. 6, the two larger magnitude curves are the skewed input voltages $V_{s1}$ and $V_{s2}$. The two smaller magnitude curves, aligned to a high precision are the output voltages $V_1$ and $V_2$. Assume that input skew is small and R<ωL, (where L is the inductance of the shunt, R is the resistance of the shunt, and ω is the clock frequency) by superposition of all possible traveling and standing waves in the transmission line the following skew expression is obtained.

$$\Delta\phi = \frac{1 - e^{-\frac{\pi R}{\omega L}}}{1 + e^{-\frac{\pi R}{\omega L}}}\phi \quad (1)$$

Spice simulations have been used to validate equation (1). From the skew equation (1), it is apparent that when resistance R approaches zero, the transmission line becomes lossless. As a result, $\Delta\Phi$, the phase shift between voltages $V_1$ and $V_2$, also approaches zero. Two clock drivers get fully synchronized. When R approaches infinity, nodes 1 and 2 are open, at which point there is no shunt effect and the phase shift between nodes 1 and 2 remains the input skew, $\Phi$.

An equation to model the skew expression to characterize the shunt effect of multiple clock drivers connected to a transmission line may also be derived under following assumptions: i) the transmission line is infinitely long and the clock drivers are spaced evenly on the transmission line with separation of one wavelength; ii) the input phase of each voltage source to be a random number uniformly distributed in [0, $\Phi$]. Because it is an infinitely long line, it can be assumed that there are two nodes a, b having exact phase 0 and $\Phi$, respectively. Then, it is possible to compute the expected phase of these two points, and take the difference of the expectations as the skew.

Assume the driving resistance is much larger than the characteristic impedance of the transmission line and the input skew is small. Using a similar technique in the derivation of equation (1), the following skew equation is obtained.

$$\Delta\phi = \frac{1 - e^{-\frac{3\pi R}{\omega L}}}{1 + e^{-\frac{3\pi R}{\omega L}}}\phi \quad (2)$$

An optimum area for transmission lines may now be determined. To provide an example, it is assumed that a pair of coplanar copper transmission lines is used to construct a spiral shunt. The two parallel differential wires have height 240 nm, and the same width w. The separation between them is 2 um, and the wires are 3.5 um above a ground plane. Typical value of w ranges from 0.5 to 40 um.

The fast field solver was used to get the frequency dependant resistance, R, and inductance, L. Linear regression is used to get the relation between resistance/inductance ratio, R/L, and wire width, w. The R/L~1/w relation displays excellent linearity.

The skew function of each level of the spiral shunt network (modeling the network 18 of FIG. 2B) may be rewritten as $$\Delta\phi = \frac{1 - c_i e^{-\frac{k_i}{\omega_i}}}{1 + c_i e^{-\frac{k_i}{\omega_i}}}\phi \quad (4)$$

Where, $w_i$ is the width of the ith level spiral and $c_i$, $k_i$ are constants for level i spiral. The optimal spiral sizing problem is written as the following mathematical programming:

Min:

$$\Delta\phi = \left(\left(\left(\phi_1 \frac{1-c_1 e^{-\frac{k_1}{w_i}}}{1+c_1 e^{-\frac{k_1}{w_i}}}\right) + \phi_2 \frac{1-c_2 e^{-\frac{k_2}{w_2}}}{1+c_2 e^{-\frac{k_2}{w_2}}} + \phi_3\right) \ldots + \phi_n\right) \quad (5)$$

$$\frac{1-c_n e^{-\frac{k_n}{w_n}}}{1+c_n e^{-\frac{k_n}{w_n}}} \quad \text{s.t.: } \sum_{i=1}^{n} l_i w_i = A$$

In the programming (5), $\Phi_i$ is the skew of signal propagation from level i-1 to level i spiral. $L_i$ and $w_i$ are length and width of the spiral of level i. The object is to minimize skew under the maximum routing area constraint A.

The following lemma has been proved.

Lemma: $f(w) = \frac{1-ce^{-k/w}}{1+ce^{-k/w}}$ is a convex function on $w \in \left[\frac{k}{2}, \infty\right)$, where, k is a positive constant.

The above lemma suggests that, when the wire of the transmission line is wide enough, the skew~wire-width relation is convex. In order to make the programming convex, a set of minimal wire width constraints may be imposed upon each level spiral.

In experiments that were conducted, the minimal wire widths of each level mesh were set as 0.6 um, 1.3 um, 1.3 um (lowest to highest level). With the minimal wire width constraints for each level spiral, the following convex program is obtained.

Min:

$$\Delta\phi = \left(\left(\left(\phi_1 \frac{1-c_1 e^{-\frac{k_1}{w_i}}}{1+c_1 e^{-\frac{k_1}{w_i}}}\right) + \phi_2 \frac{1-c_2 e^{-\frac{k_2}{w_2}}}{1+c_2 e^{-\frac{k_2}{w_2}}} + \phi_3\right) \ldots + \phi_n\right) \quad (6)$$

$$\frac{1-c_n e^{-\frac{k_n}{w_n}}}{1+c_n e^{-\frac{k_n}{w_n}}} \quad \text{s.t.: } \sum_{i=1}^{n} l_i w_i = A$$

$$w_i > m_i, \forall i \in (1, 2, \ldots, n)$$

Due to the convex property of the program (6), the following theorem is obtained.

Theorem: The local optimum of the programming (6) is the global optimum.

According to the above theorem, many numerical methods such as gradient descendant and line search methods can be adopted to solve this class of programming. In example experiments, the programs were solved using the optimization package of MATLAB. The example experimental results are presented.

EXPERIMENTAL RESULTS

In the experiments, the chip size was set to be 2 cm by 2 cm, and a three level spiral (like that shown in FIG. 2B was used to shunt clock signals). The clock frequency is 10.336 GHz. The wave length is exactly 1 cm. Each of the spirals had 4, 9, and 17 clock drivers respectively. A balanced H-tree was synthesized to distribute clock signal from the center of the chip to the clock drivers. The designed arriving time of all drivers on the same level spiral is equal. With given process variations model, simulations obtained the worst skew of the signal propagation from one level to the next level based on SPICE simulation. These skews were used as the values of $\Phi_i$ in the convex programming. Routing area was normalized to the area of bottom level spiral with 1 um wire width.

TABLE 1

Optimized wire width of each level spiral for 3 level spiral

| Total Area | W1 (um) | W2 (um) | W3 (um) | Skew M (ps) | Skew S (ps) | Impr. (%) |
|---|---|---|---|---|---|---|
| 0 | 0 | 0 | 0 | 23.15 | 23.15 | 0% |
| 0.5 | 1.7 | 0 | 0 | 17.796 | 20.50 | 13% |
| 1 | 1.9308 | 1.0501 | 0 | 12.838 | 14.764 | 13% |
| 3 | 2.5751 | 1.3104 | 1.3294 | 8.6087 | 8.7309 | 15% |
| 5 | 2.9043 | 3.7559 | 2.3295 | 6.2015 | 6.3169 | 16% |
| 10 | 3.1919 | 4.5029 | 6.8651 | 4.2755 | 5.2131 | 18% |
| 15 | 3.6722 | 6.1303 | 10.891 | 2.4917 | 3.5182 | 29% |
| 20 | 4.0704 | 7.5001 | 15.072 | 1.7070 | 2.6501 | 37% |
| 25 | 4.4040 | 8.6979 | 19.359 | 1.2804 | 2.1243 | 40% |

Table 1 lists the optimized wire width of each level spiral for different total routing area. W1, W2, and W3 are optimal wire widths of level 1, level 2 and level 3 spirals, respectively. For the comparison reason, we also simulate the skew on a single-level spiral network, which only uses bottom level spiral to shunt all the leaf nodes of the H-tree. We let the single level spiral network has same total routing area of the multi-level spirals network. Column 5 and 6 are the skews of multi-level spirals and single level spiral. Column 7 shows the skew improvement of multi-level spirals over single level spiral. When total routing area is small, the optimal configurations prefer to allocate routing resources to the higher level mesh. With gradually increasing of the routing area, more resources are allocated to the bottom level mesh. Comparing with the single-level spiral, optimized multi-level spiral can reduce the skew by 40%.

Simulations also compared power consumption of an optimized multilevel spiral network and that of single level spiral. In Table 2, the first row are the total routing areas of the multi-level spirals; the second row and the third row list the power consumption of the multilevel spiral and single level spiral with given amount of total routing area. The simulated results show that multilevel spiral can reduce the power consumption by 81%.

TABLE 2

Power Consumption Comparisons

| | Area | | | | | | |
|---|---|---|---|---|---|---|---|
| | 3 | 4 | 5 | 7 | 10 | 15 | 20 | 25 |
| PM(mw) | 0.4 | 0.5 | 0.7 | 0.9 | 1.0 | 1.4 | 1.5 | 1.6 |
| PS(mw) | 0.83 | 1.5 | 2.1 | 2.64 | 3.04 | 4.7 | 7.2 | 8.3 |
| reduce(%) | 48 | 67 | 67 | 66 | 67 | 70 | 79 | 81 |

The robustness of optimized spirals network against supply voltage fluctuations was also tested in simulations. For the test the supply voltage of every clock driver was perturbed independently by a random number within 10% of its nominal value. 5 experiments were performed on each network. The worst case skew and average case skew are shown in Table 3. The skew of optimized multilevel spiral and single level spiral networks is compared. The last column of Table 3 lists the improvement of the average case skew. Multilevel spiral network improves the skew by up to 55%.

TABLE 3

Skew in the presence of voltage variations

| Area | Skew-S | | Skew-M | | Impr (%) |
|---|---|---|---|---|---|
| | Ave. | Worst | Ave. | Worst | |
| 0 | 28.4 | 36.5 | 28.4 | 36.5 | 0% |
| 3 | 9.75 | 12.33 | 8.75 | 9.07 | 11% |
| 5 | 7.32 | 9.06 | 6.55 | 6.91 | 12% |
| 10 | 6.31 | 805 | 4.41 | 5.41 | 30% |
| 15 | 5.03 | 7.33 | 2.81 | 4.93 | 44% |
| 25 | 3.83 | 4.61 | 1.72 | 3.06 | 55% |

When the clock frequency deviates from its nominal value or the electrical length of transmission lines varies from integral multiple of the wavelength, the resonance phenomena of the transmission line shunts diminishes. As a result, the synchronization capabilities of transmission line shunts degrade accordingly. The frequency response properties of the multi-level clock network of FIGS. 2A and 2B was also tested by simulation. The wire width of the lowest level transmission line was set to be 5 um wide and the clock rate to be 10.33 GHz. The −3 db bandwidth of the output voltages was 0.42 GHz. At 10.33 GHz, a minimal skew of 1.38 degrees is achieved. In the frequency range of 10.2 GHz to 10.5 GHz, the skew lies between 2.5 degrees and 1.38 degrees.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A VLSI clock distribution circuit, comprising:
   a clock distribution tree having multiple levels, a plurality of drivers in each of the levels having a substantially similar distance from the center of the clock distribution tree; and
   at least one set of differential transmission lines, the set of differential transmission lines connecting drivers in a common level of the clock distribution tree, the length of the differential transmission lines between drivers being an integral multiple of the wavelength of a clock signal being distributed by said clock distribution tree.

2. The circuit of claim 1, wherein said at least one set of differential transmission lines comprises a plurality of sets of differential transmission lines.

3. The circuit of claim 2, wherein the length of the differential transmission lines between drivers is equal to one wavelength of the clock signal being distributed by said clock distribution tree.

4. The circuit of claim 3, wherein said clock distribution tree comprises an H-tree that receives the clock signal being distributed at its center, and each of said plurality of sets of differential transmission lines comprises a spiral that connects drivers on a common level of the H-tree.

5. The circuit of claim 4, wherein widths of plurality of sets of transmission lines are optimized to minimize skew between drivers in said clock distribution tree.

6. The circuit of claim 2, wherein said clock distribution tree comprises an H-tree that receives the clock signal being distributed at its center, and each of said plurality of sets of differential transmission lines comprises a spiral that connects drivers on a common level of the H-tree.

7. The circuit of claim 6, wherein widths of plurality of sets of transmission lines are optimized to minimize skew between drivers in said clock distribution tree.

8. The circuit of claim 7, further comprising a clock source providing said clock signal as a sinusoidal clock signal at the center of said clock distribution tree.

9. The circuit of claim 8, wherein drivers connected to a lowest level spiral of said plurality of sets of differential lines comprise sine to square wave converters.

10. The circuit of claim 9, further comprising a local distribution network receiving square wave clock signals from said drivers connected to the lowest spiral.

11. A method for distributing clock signals in a VLSI circuit, the method comprising steps of:
   distributing sinusoidal clock signals among clock drivers in the VLSI circuit through a multi-level clock distribution tree;
   shunting clock drivers in each common level of the clock distribution tree with a differential transmission line, wherein the length of the differential transmission line between each clock driver is an integral multiple of the clock signals.

* * * * *

UNITED STATES PATENT AND TRADEMARK OFFICE
CERTIFICATE OF CORRECTION

PATENT NO. : 7,679,416 B2 Page 1 of 1
APPLICATION NO. : 11/596968
DATED : March 6, 2010
INVENTOR(S) : Chung-Kuan Cheng et al.

It is certified that error appears in the above-identified patent and that said Letters Patent is hereby corrected as shown below:

In the Specification:

Col. 5, line 5
Please delete "26, (clock +)" and insert --$26_1$ (clock +)-- in its place.

Col. 5, line 19
Before "which would be" please insert --(--.

Col. 5, line 23
Please delete "drivers 20," and insert --drivers 201-- in its place.

Signed and Sealed this

Tenth Day of August, 2010

David J. Kappos
*Director of the United States Patent and Trademark Office*